(12) United States Patent
Abraham et al.

(10) Patent No.: US 11,993,864 B2
(45) Date of Patent: May 28, 2024

(54) SILICON CARBIDE MAGNETOMETER AND ASSOCIATED MATERIAL FORMATION METHODS

(71) Applicant: The Johns Hopkins University, Baltimore, MD (US)

(72) Inventors: John B. Abraham, Baltimore, MD (US); Brian D. Clader, Ellicott City, MD (US); Robert Osiander, Columbia, MD (US); Cameron A. Gutgsell, Laurel, MD (US); Dalibor J. Todorovski, Columbia, MD (US); Scott A. Sperling, Baltimore, MD (US); Jacob E. Epstein, Takoma Park, MD (US); Timothy M. Sweeney, Fulton, MD (US); Elizabeth A. Pogue, Laurel, MD (US); Tyrel M. McQueen, Baltimore, MD (US)

(73) Assignee: The Johns Hopkins University, Baltimore, MD (US)

( * ) Notice: Subject to any disclaimer, the term of this patent is extended or adjusted under 35 U.S.C. 154(b) by 199 days.

(21) Appl. No.: 17/516,956

(22) Filed: Nov. 2, 2021

(65) Prior Publication Data
US 2022/0136135 A1    May 5, 2022

Related U.S. Application Data

(60) Provisional application No. 63/109,503, filed on Nov. 4, 2020.

(51) Int. Cl.
C30B 33/02    (2006.01)
C30B 29/36    (2006.01)
C30B 33/04    (2006.01)
G01R 33/032    (2006.01)

(52) U.S. Cl.
CPC .............. *C30B 33/02* (2013.01); *C30B 29/36* (2013.01); *C30B 33/04* (2013.01); *G01R 33/032* (2013.01)

(58) Field of Classification Search
CPC ......... C30B 33/02; C30B 29/36; C30B 33/04; G01R 33/032; G01R 33/007; G01R 33/0052; G01R 33/26; G01R 33/323
USPC ...................................................... 324/244.1
See application file for complete search history.

(56) References Cited

U.S. PATENT DOCUMENTS 6,273,950 B1 * 8/2001 Kitabatake .......... H01L 21/0495
257/E21.054
6,964,917 B2 11/2005 Tsvetkov et al.

OTHER PUBLICATIONS

Lefèvre, Jérémie, et al. "Thermal stability of irradiation-induced point defects in cubic silicon carbide." Journal of Applied Physics 106.8 (2009). (Year: 2009).*

(Continued)

*Primary Examiner* — Christopher P McAndrew
(74) *Attorney, Agent, or Firm* — Noah J. Hayward

(57) ABSTRACT

A method for forming a silicon carbide material with a plurality of negatively charged silicon mono-vacancy defects includes irradiating a silicon carbide sample, annealing the irradiated silicon carbide sample in an annealing operation, and quenching the annealed silicon carbide sample. Quenching may include heating the annealed silicon carbide sample to a maximum temperature and quenching the annealed silicon carbide sample to form the silicon carbide sample with the plurality of negatively charged silicon mono-vacancy defects.

8 Claims, 11 Drawing Sheets

(56) References Cited

OTHER PUBLICATIONS

Zhang, Zesheng, et al. "Intrinsic ferromagnetism in 4H-SiC single crystal induced by Al-doping." Applied Physics A 126 (2020): 1-8. (Year: 2020).*

John B. S. Abraham et al., "Nanotesla Magnetometry with the Silicon Vacancy in Silicon Carbide," Physical Review Applied 15, 064022, 2021, pp. 1-9.

J.-F. Wang et al., "Optimization of power broadening in optically detected magnetic resonance of defect spins in silicon carbide," Phys. Rev. B 101, 064102, 2020, pp. 1-6.

D. Simin et al., "All-Optical dc Nanotesla Magnetometry Using Silicon Vacancy Fine Structure in Isotopically Purified Silicon Carbide," Phys. Rev. X 6, 031014, 2016, pp. 1-12.

C. S. Shin et al., "Room-temperature operation of a radiofrequency diamond magnetometer near the shot-noise limit," J. Appl. Physics 112, 124519, 2012, pp. 1-11.

* cited by examiner

SILICON CARBIDE MAGNETOMETER AND ASSOCIATED MATERIAL FORMATION METHODS

CROSS-REFERENCE TO RELATED APPLICATIONS

This application claims priority to and the benefit of prior-filed, U.S. Provisional Application No. 63/109,503 filed on Nov. 4, 2020, the entire contents of which are hereby incorporated herein by reference.

TECHNICAL FIELD

Example embodiments generally relate to material science and, in particular, relate to silicon carbide materials with defects that can be leveraged for magnetometry.

BACKGROUND

Magnetometers are devices that can be employed to measure a magnetic field and can be as simple to implement as the needle of a compass. Laboratory magnetometers measure, for example, the magnetization, or magnetic moment, of a sample material and the effects on the material that are related to magnetism. A variety of magnetometers and associated designs exist with each having different strengths and weaknesses. For example, some magnetometers are quite difficult to maintain calibration, particularly in varying temperature environments. In some instances, the ability to accurately calibrate and therefore detect the strength of a magnetic field using a magnetometer can be highly temperature dependent.

It has been determined that some magnetometers may be constructed by leveraging the presence of atom vacancies or defects in a given substance, such as, for example, a diamond nitrogen vacancy. However, the ability to form materials with the diamond nitrogen vacancy involve complex and costly fabrication processes and the materials themselves are costly to obtain. As such, while the leveraging of such defects for use in magnetometry applications would be beneficial, less costly solutions in this area of technology with less complex fabrication procedures are desired. Such solutions may find uses beyond magnetometers to support a variety of applications, such as quantum-related applications.

BRIEF SUMMARY

According to some example embodiments, an example method for forming a silicon carbide material with a plurality of negatively charged silicon mono-vacancy defects is provided. The example method includes irradiating a silicon carbide sample, annealing the irradiated silicon carbide sample in an annealing operation, and quenching the annealed silicon carbide sample. Quenching may include heating the annealed silicon carbide sample to a maximum temperature and quenching the annealed silicon carbide sample to form the silicon carbide sample with the plurality of negatively charged silicon mono-vacancy defects.

According to some example embodiments, a magnetometer apparatus is provided. The magnetometer apparatus may include a laser, a silicon carbide sample with a plurality of negatively charged silicon mono-vacancy defects, and a detector configured to receive an optical signal after interaction with the silicon carbide sample and originating from the laser. The optical signal may include information about a magnetic field that has been subjected to the silicon carbide sample.

According to some example embodiments, a material is provided. The material may include silicon carbide with a plurality of negatively charged silicon mono-vacancy defects. Further, the material exhibits a shot noise sensitivity in a range of about 3.5 nT/$\sqrt{Hz}$ to 2.0 nT/$\sqrt{Hz}$.

BRIEF DESCRIPTION OF THE SEVERAL VIEWS OF THE DRAWING(S)

Having thus described some example embodiments in general terms, reference will now be made to the accompanying drawings, which are not necessarily drawn to scale, and wherein:

DETAILED DESCRIPTION

Figure 1:
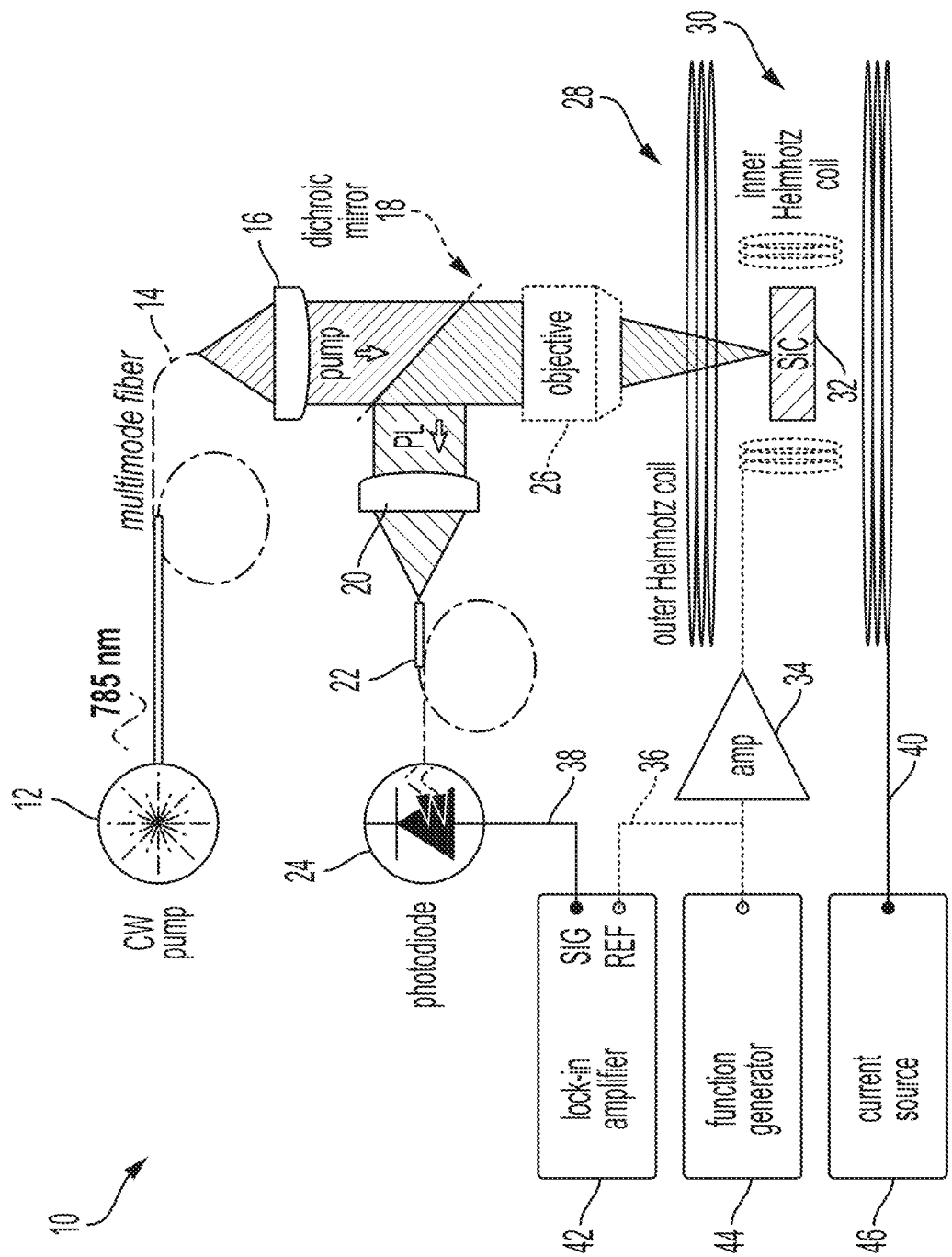
FIG. 1 illustrates a magnetometry system for magnetic resonance and power broadening measurements according to some example embodiments.

Some example embodiments now will be described more fully hereinafter with reference to the accompanying drawings, in which some, but not all example embodiments are shown. Indeed, the examples described and pictured herein should not be construed as being limiting as to the scope, applicability or configuration of the present disclosure. Rather, these example embodiments are provided so that this disclosure will satisfy applicable legal requirements. Like reference numerals refer to like elements throughout. Furthermore, as used herein, the term "or" is to be interpreted as a logical operator that results in true whenever one or more of its operands are true. As used herein, operable coupling should be understood to relate to direct or indirect connection that, in either case, enables functional interconnection of components that are operably coupled to each other.

According to various example embodiments, a magnetometer and other related devices may be constructed using a silicon carbide (SiC) material that may be formed as described herein. In this regard, according to some example embodiments the SiC material may be structured as, for example, a 4H—SiC material, which is a four layer hexagonal polytype of SiC. The SiC material, according to some example embodiments, may leverage the characteristics of a negatively charged silicon mono-vacancy, referred to as $V_{Si}^-$, as a structural defect to support operation in the context of a magnetometry applications and implementations. A vacancy defect, such as the $V_{Si}^-$, can be a point defect in a crystalline material where, for example, an atom is missing from a lattice site. The SiC material including this defect, according to some example embodiments, may be formed to exhibit, for example, a shot noise limited sensitivity of 3.5 nT/√Hz, thereby realizing an extremely sensitive implementation of a magnetometer. As such, according to some example embodiments, a magnetometer may be constructed by improving the material properties of a SiC sample by, for example, rapid quenching the sample after a heating process, which may be characterized by power broadening of the system to optimize the optical and RF power in the process.

The example techniques and resultant SiC materials described herein can open a number of new avenues for improving, for example, the yield of silicon vacancies in SiC and provide for the performance of magnetometry with ensembles of the defect formed in SiC. Based on the described improvements in defect density and contrast with quenching the sample SiC after annealing, possibly in combination with laser formation of the $V_{Si}^-$, ultrafast laser processing becomes a viable path to further improve the yield of defect formation for neutron irradiated SiC samples. In this regard, the procedure can dramatically reduce the time scale of defect formation and the return to equilibrium. Additionally, according to some example embodiments, greater sensitivity may be attainable through annealing and quenching electron irradiated samples, as described herein. Such greater sensitivity may be valuable in view of the achievement of greater $T_2$ times that have been realized with electron versus neutron irradiation. The coarse optimization of annealing parameters can also be realized based on the approaches described herein to realize further improvements. Additionally, further improvements, according to some example embodiments, may be realized in relation to the relative densities of the $V_{Si}^-$ and $V_C C_{Si}^{2+}$ in other polymorphs such as SiC 3C (three layer cubic symmetry). Further, according to some example embodiments, an improved sensitivity may be identified through implementing pulsed optically detected magnetic resonance (ODMR) and other coherent techniques.

Due to the $V_{Si}^-$ not being relatively bright or high in ODMR contrast, relative to, for example, the diamond nitrogen vacancy (DNV), it is unexpected that a sensitive magnetometer may be developed using the $V_{Si}^-$ as described herein. Additionally, the use of the $V_{Si}^-$ in this, and many other contexts, is therefore a critical development because of the variety of advantages that SiC has over diamond with regards to, for example, cost and mature microfabrication techniques. Additionally, electroluminescence can be demonstrated with the $V_{Si}^-$, whereas it has been attempted repeatedly with the DNV with no success. Accordingly, the ability to form and leverage the $V_{Si}^-$ in this context can allow for implementations such as a quantum magnetometer integrated on chip with SiC, having a sensitivity that is comparable to DNV solutions. Additionally, the use of SiC and the $V_{Si}^-$ as described according to some example embodiments herein, allows for 'on chip' solutions that include the construction of a network of magnetometers that may be implemented as an array of magnetometers (e.g., relatively small magnetometers). Such an array of magnetometers may be used to perform magnetic gradiometry techniques, which has been proven to be an approach for accurate navigation. This implementation may be include, for example, synchronizing the array and the control system with a common clock to facilitate operation as a phased array.

As such, according to some example embodiments, a sensitive and internally calibrated magnetometer may be realized based on silicon vacancy defects $V_{Si}^-$ formed in silicon carbide, in accordance with methods described herein. Evaluation of the SiC samples treated as described herein may operate by optically pumping the $V_{Si}^-$ with a laser, e.g., a 785 nanometer laser, and applying a frequency modulated radio frequency (RF) magnetic field to the $V_{Si}^-$ through a Helmholtz coil. According to some example embodiments, a fluorescence may be emitted by the $V_{Si}^-$ (e.g., a 900 nanometer fluorescence) may be detected by a photodetector and the output may be measured by a lock-in amplifier referenced to the RF modulation. An RF tone may be adjusted to null the output of the lock-in detector. A control system may be implemented to monitor and control the process. The sensitivity of the SiC samples and thus the magnetometer system, according to some example embodiments, may be in ranges of 3.5 nT/√Hz to 2.0 nT/√Hz, with increased sensitivity at the pico-level being possible. Such sensitives may be utilized in applications including magnetic navigation, at least in part because, according to some example embodiments, the $V_{Si}^-$-based system's response is not temperature dependent and is therefore robust.

Using SiC in these contexts can be beneficial because, as a host material, SiC can form a spin defect that is useful in the development of magnetometry solutions such as quantum sensors for use in quantum computing. Additionally, SiC is commercially available and techniques have been established for electrical and optical microfabricated device integration using SiC. The negatively charged silicon vacancy $V_{Si}^-$ has been a spin defect of interest because of its near telecom photoemission, high spin number, and nearly temperature independent ground state zero field splitting. In addition to these benefits, example embodiments exhibit nanoTesla (nT) shot-noise in limited ensemble magnetometry based on optically detected magnetic resonance with the silicon vacancy in 4H SiC. As further described herein, by coarsely optimizing the anneal parameters and minimizing power broadening, a sensitivity of about 3.5 nT/√Hz can be realized. Such sensitively may be realized, according to some example embodiments, without utilizing complex photonic engineering, control protocols, or applying excitation powers greater than a Watt. As such, the $V_{Si}^-$ in SiC can be leveraged to create a low-cost and efficient approach to sensing of magnetic fields and quantum sensing of magnetic fields.

In this regard, spin defect quantum sensing can revolutionize a significant number of technical fields ranging from fundamental physics to biological systems, due to their high sensitivity and spatial selectivity. Therefore, magnetic field sensing with spin defects has become an area of focus. The negatively charged silicon mono-vacancy $V_{Si}^-$ in SiC 4H includes a spin defect that may be leveraged for magnetometry and other applications. One reason for the consideration of the $V_{Si}^-$ spin defect is due to the number of common properties with the diamond nitrogen vacancy (DNV), which has been leveraged in some of these contexts. Additionally, SiC, as described herein, has additional properties which are unique to the defect and host material, and are also beneficial for many applications.

Like the DNV, the energy structure of the $V_{Si}^-$ includes an inter-system crossing which spin polarizes the defect with optical pumping. The $V_{Si}^-$ is a spin-3/2 system with coherence times comparable to those of DNV centers. The spin of the $V_{Si}^-$ is therefore 3/2. As such, Kramer's degeneracy theorem can apply to the symmetry of the defect ground state. As a result, the $V_{Si}^-$ can realize essentially temperature independent ground state zero field splitting. In fact, relative to DNV, the $V_{Si}^-$ in SiC, according to some example embodiments, is orders of magnitude less temperature sensitive than the DNV. Since the defect has a spin greater than one, multiple transitions can be interrogated, which can be used for vector magnetometry, all optical DC magnetometry, and qudit (quantum states of dimension 4) magnetometry. In addition to the compelling spin properties of the $V_{Si}^-$ defect, the defect has demonstrated an ability to be excited electrically and its state may be measured through spin dependent recombination.

Such properties of the $V_{Si}^-$ supports usage in quantum systems in, for example, an entirely electrical manner. As such, magnetometry with solid state spin defects can be realized using the $V_{Si}^-$ in a SiC material. For example, continuous wave optically detected magnetic resonance (CW ODMR) is an example of one of the fundamental magnetometry techniques that can be performed using the $V_{Si}^-$ defect. Although CW ODMR may not be an extremely sensitive technique, such an implementation can be leveraged in a number of applications and for sensitivity comparisons for different spin defects. CW ODMR can rely on a change in fluorescence intensity when an applied radio-frequency (RF) field is resonant with a ground state spin transition, typically of magnetic quantum number m=1. The ground state transition energies can be a function of the ambient magnetic field through the Zeeman effect. Thus, the ambient magnetic field can be measured through the ground state transition energy or applied RF frequency through a change in the photoluminescence intensity. Such change in photoluminescence intensity may be detected by a photo sensor and a signal indicating the intensity may be provided to a processor for analysis. In this regard, the ground state transition frequency can be given by:

$$\nu = \nu_{ZFS} \pm \gamma B_0 \quad (1)$$

where $\nu_{ZFS}$=70 MHz is the zero field splitting for the $V_{Si}^-$ in 4H—SiC, $\gamma$ is the electron gyromagnetic ratio, and $B_0$ is the ambient magnetic field strength. The sensitivity of ODMR magnetometry can typically be limited by the shot noise sensitivity, which stems from the statistics of photon emission from the spin defects. The shot noise limited sensitivity may take the following form:

$$\eta_B = \frac{4\sqrt{2}}{3\sqrt{3}} \frac{h}{g\mu_B} \frac{\Delta}{C\sqrt{R}}, \quad (2)$$

where $\Delta$ is the full width half maximum (FWHM) of the ODMR line-width, C is the ODMR fluorescence contrast, R is the rate of detected photons from the defect ensemble, g≈2.0032 is the Landé g factor for the $V_{Si}^-$ spin defect, and h and $\mu_B$ are Planck's constant and the Bohr magneton, respectively. The linewidth $\Delta$ may be inversely proportional to the spin dephasing time of the defect, $T_2^*$, while C and R may depend on many terms such as the Rabi frequency, transition rates, defect brightness, and optical collection efficiency.

Accordingly, the order of magnitude improvement in the sensitivity of CW ODMR magnetometry with an ensemble of $V_{Si}^-$ by optimizing the annealing parameters can be shown. As mentioned above, a shot noise sensitivity of 3.5 nT/$\sqrt{Hz}$ can be realized, which is a significant improvement.

Referring now to FIG. 1, a magnetometry system 10 for ODMR and power broadening measurements is shown that can be used as a magnetometer based on a SiC sample as described herein, and for measuring the sensitivity of the SiC sample 32. A continuous wave laser pump 12, e.g., with a 785 nm laser, may be focused through a multimode fiber 14 on the SiC sample 32 with an objective lens 26. The lens assembly may include a pump lens 16, a dichronic mirror 18, output lens 20, and the objective lens 26. According to some example embodiments, the pump lens 16 may be a pump collimation lens. The laser pump signal may pass through the pump lens 16, the mirror 18, and the objective lens 26 to be reflected back from the SiC sample 32 through the objective lens 26 to be reflected by the mirror 18. From the mirror 18, the signal may pass through the lens 20 and into the multimode fiber 22 for detection by the photodiode 24. Moreover, the sample fluorescence that is reflected may be collected by the same objective lens 26 and passed through the lens 20 operating as a 850 nm long-pass filter and measured with the photodiode 24 operating as a photodetector. The photodiode 24 may be electrically connected to a signal-in SIG of a lock-in amplifier 42. An outer Helmholtz coil 28 may be driven by a current source 46 to apply a static field along a c axis, or a longitudinal axis of the SiC sample 32. An inner Helmholtz coil 30 may be driven by a function generator 44 with a modulated RF tone that is provided to the inner Helmholtz coil 30 via an amplifier 34. The function generator 44 may also output the modulated RF tone to reference channel 36 t a reference-in REF of the lock-in amplifier 42. Accordingly, the lock-in amplifier 42 may include or be connected to processing circuitry configured to compare the signal 38 from the photodiode 24 with the output 36 of the function generator 44, being used as the reference signal, to determine the sensitivity of the SiC sample 32.

Figure 2:
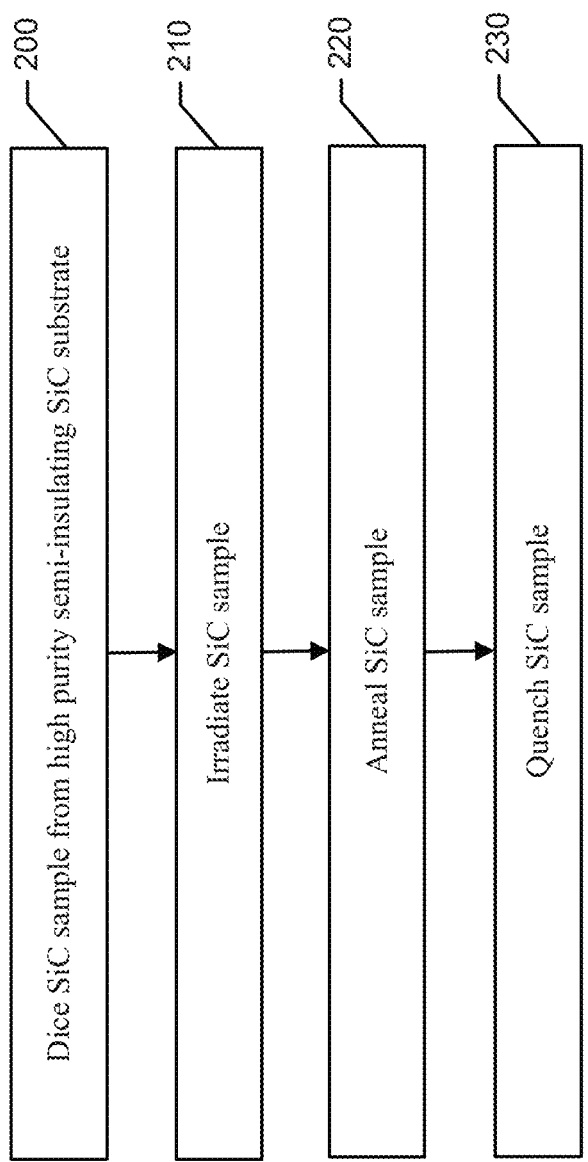
FIG. 2 illustrates a flowchart of an example method of forming a silicon carbide sample with a plurality of negatively charged silicon mono-vacancy defects according to some example embodiments.

Having described a system for determining a sensitivity of a SiC sample 32 that is formed in accordance with example embodiments described herein, the following describes example processes and techniques for forming a SiC sample with $V_{Si}^-$ defects. Some example methods will be described with respect to the flowchart of FIG. 2. Initially, according to some example embodiments, at 200, a raw SiC sample may be cut or diced from, for example, a high purity semi-insulating SiC substrate. According to some example embodiments, a high purity layer having a residual nitrogen doping below $5.0\times10^{14}$ cm$^{-3}$ and may be epitaxially grown on an n-type 4H—SiC wafer. Further, according to some example embodiments, the high purity layer may be covered by a layer of n-type 4H—SiC and a layer of p-type 4H—SiC prior to cutting or dicing.

At 210, the SiC sample may be irradiated, for example, by a nuclear reactor. According to some example embodiments, the irradiation operation may include neutron irradiation. In this regard, a nuclear reactor may provide a source of high fluence, fast neutrons. Irradiation may be performed using neutron energies that range from, for example, 0.18 meV to 2.5 meV. According to some example embodiments, the SiC sample may be irradiated with a fluence of $10^{17}$ n°/cm². The neutron irradiation operation may introduce a form of ionizing radiation to the SiC sample that presents as free neutrons that may cause defects within the SiC to be formed. Because the neutrons are electrically neutral, the neutron may not be a fundamentally ionizing form of radiation, although, at least in some instances, second and third order effects may occur resulting in some ionization. In this regard, neutrons often interact with SiC in two ways. First, the neutron may knock substrate nuclei out of their lattice position, and the displaced atoms can be referred to as primary knock-on atoms (PKA). When such PKAs move through the lattice, the PKAs can create a relatively small amount of ionization. In the second way, neutrons can cause transmutation. In this regard, for SiC, primarily $^{30}$Si+ $n_0 \rightarrow ^{31}$Si$\rightarrow ^{31}$P ($^{31}$phosphorus), thereby changing minute amounts of the already minute amount of $^{31}$Si to $^{31}$P. According to some example embodiments, at this point in the example method, an estimate for the silicon vacancies or defect density may be $\sim 10^{15}$ $V_{Si}^-$/cm³. Post-irradiation, the SiC sample may be noticeably opaque.

Following irradiation, the SiC sample may be annealed, for example, in vacuum, at 220. According to some example embodiments, the annealing operation at 220 may involve a first heating operation for the SiC sample. The annealing may be performed as a heat treatment operation that, for example, raises the temperature of the SiC sample at a desired increasing rate to a desired temperature, and then reduces the temperature of the SiC sample, at a desired decreasing rate, to, for example, ambient temperature. The annealing process may cause the internal strains or stresses in the material to be released and the material may formed into an equilibrium state. According to some example embodiments, the SiC sample may be annealed at a temperature of about 600° C. as the desired maximum temperature for about 4 hours.

More specifically, according to some example embodiments, the annealing at 220 may include soaking the SiC sample at 200° C. for a duration of time to evaporate any undesired particles on the SiC sample. The temperature of the bath may then be increased at a rate of about 60° C./hour until the bath and the SiC sample reaches the maximum annealing temperature of about 600° C. The SiC sample may be maintained at the maximum annealing temperature for a duration of time, such as, for example, 2 to 8 hours. According to some example embodiments, upon completion of the maximum annealing temperature duration, the SiC sample may be permitting to cool (e.g., by permitting the SiC sample to cooled to room or ambient temperature, e.g., about 20° C., in a relatively slow manner). The cooling process incorporated into the first annealing may be slow and perform in an uncontrolled, 'open air' cooling process or in a slow, but controlled process. According to some example embodiments, the cooling process incorporated into the first annealing may bring the SiC sample to room temperature over a duration of tens of minutes or hours (e.g., slower than 100° C./minute).

According to some example embodiments, after annealing at 220, the SiC sample may be subjected to a quenching operation at 230. The quenching operation may include another temperature raising operation and then a quenching of the SiC sample. According to some example embodiments, the temperature raising of the SiC sample in association with the quenching operation at 230 may be conducted in evacuated quartz ampoules. In this regard, according to some example embodiments, the SiC sample, after the temperature increase, may be thermally quenched by quickly removing the SiC sample from the heating apparatus (e.g., the furnace) and immersing the SiC sample is a fluid cooling bath (e.g., a water bath).

More specifically, according to some example embodiments, the quenching operation at 230 may include raising temperature of the SiC sample a second time by raising the SiC sample to a second maximum temperature for a duration of time. According to some example embodiments, the process for raising the temperature of the SiC sample as part of the quenching process may include soaking the SiC sample at 200° C. for a duration of time to evaporate any undesired particles on the SiC sample. The temperature of the bath may then be increased at a rate of about 60° C./hour until the bath and the SiC sample reaches the second maximum temperature of about 600° C. In this regard, for example, the SiC sample may be maintained at the second maximum temperature of 600° C. for, for example, four hours in the heating bath. According to some example embodiments, the SiC sample, which may be disposed within a quartz vial or container, may then be removed from the heat, e.g., the furnace, and thermally quenched via rapid cooling (e.g., with a few seconds) to below 300° C. The rapid cooling may be performed by placing the SiC sample into an ambient temperate bath of water or other cooling fluid.

Alternatively, rather than soaking the SiC sample at 200° C. and then raising the temperature by 60° C./hour, a more rapid temperature rate may be used, without performing any sustained soaking at 200° C. or otherwise. Additionally, the second maximum temperature may be higher, while the quenching portion of the operation may be the same. In this regard, the temperature of the SiC sample may be raised more rapidly, e.g., about 100° C./hour. When the SiC sample reaches this higher second maximum temperature, the SiC sample may be maintained at this temperature for a shorter time. For example, when the SiC sample reaches an 800° C. second maximum temperature, this temperature may be maintained for fifteen minutes, before quenching as described above.

The thermal quench, according to some example embodiments, limits the transformation of $V_{Si}^-$ defects to the carbon anti-site defect ($V_C C_{Si}^{2+}$) as the sample returns to room temperature. As mentioned above, the SiC sample may become opaque after irradiation, but may increase in transparency after the annealing operation at 220. The SiC sample may become even more transparent after the quenching operation at 230. The SiC sample may be referred to as a SiC sample following the quenching. Note that, as provided herein, reference to an annealed SiC sample or sample refers to a SiC sample that has been subjected to the annealing process at 220, but has not been subjected to the quenching process at 230. Also, reference to a quenched SiC sample refers to a SiC sample that has been subjected to the annealing at 220 and the quenching process at 230.

A photoluminescence microscope may be used to ascertain the characteristics of the resultant SiC sample, in association wherein the system 10 including an integrated dual set of Helmholtz coils as provided in FIG. 1. The inner Helmholtz coil 30 may apply an RF magnetic field along the plane perpendicular to the c axis of the SiC sample 32 to excite spin transitions. The inner coil 30 may be nested perpendicularly within a larger Helmholtz coil 28 which is parallel to the c axis of the SiC sample 32. The larger coil 28 may apply a static magnetic field in order to split the spin transitions through the Zeeman effect as described in Equation (1) above.

For example, a 785 nm laser diode may be focused on the sample through the objective lens 26 (e.g., a 50× objective with a numerical aperture of 0.55). For photoluminescence evaluation, the SiC sample 32 may be pumped with 100 mW of power from the continuous wave laser pump 12. For the ODMR measurements, the SiC sample 32 may be optically pumped with intensities ranging from 20 to 160 mW/μm² while the outer Helmholtz coil 28 applies a static magnetic field of 1 millitesla (mT) along the c axis of the SiC sample. A modulated RF field may be applied to the SiC sample 32 through the integrated Helmholtz coil 30 along the sample plane perpendicular to the c axis of the SiC sample 32. The photoluminescence from the SiC sample 32 may be collected by the same objective lens 26 by which the SiC sample is pumped. The signal may be reflected off a dichroic mirror 18, passed through lens 20 operating as, for example, an 850 nm long pass filter, coupled into a fiber 22 and detected by the photodiode (e.g., an InGaAs photodiode). Based on the numerical aperture of the objective lens 26, approximately 11% of the emission from the SiC sample 32 may be collected. The signal 38 from the photodetector may be output to a lock-in amplifier 42 which may detect the modulated photoluminescence produced by the resonant RF excitation based on the signal provided at 36.

Figure 3:
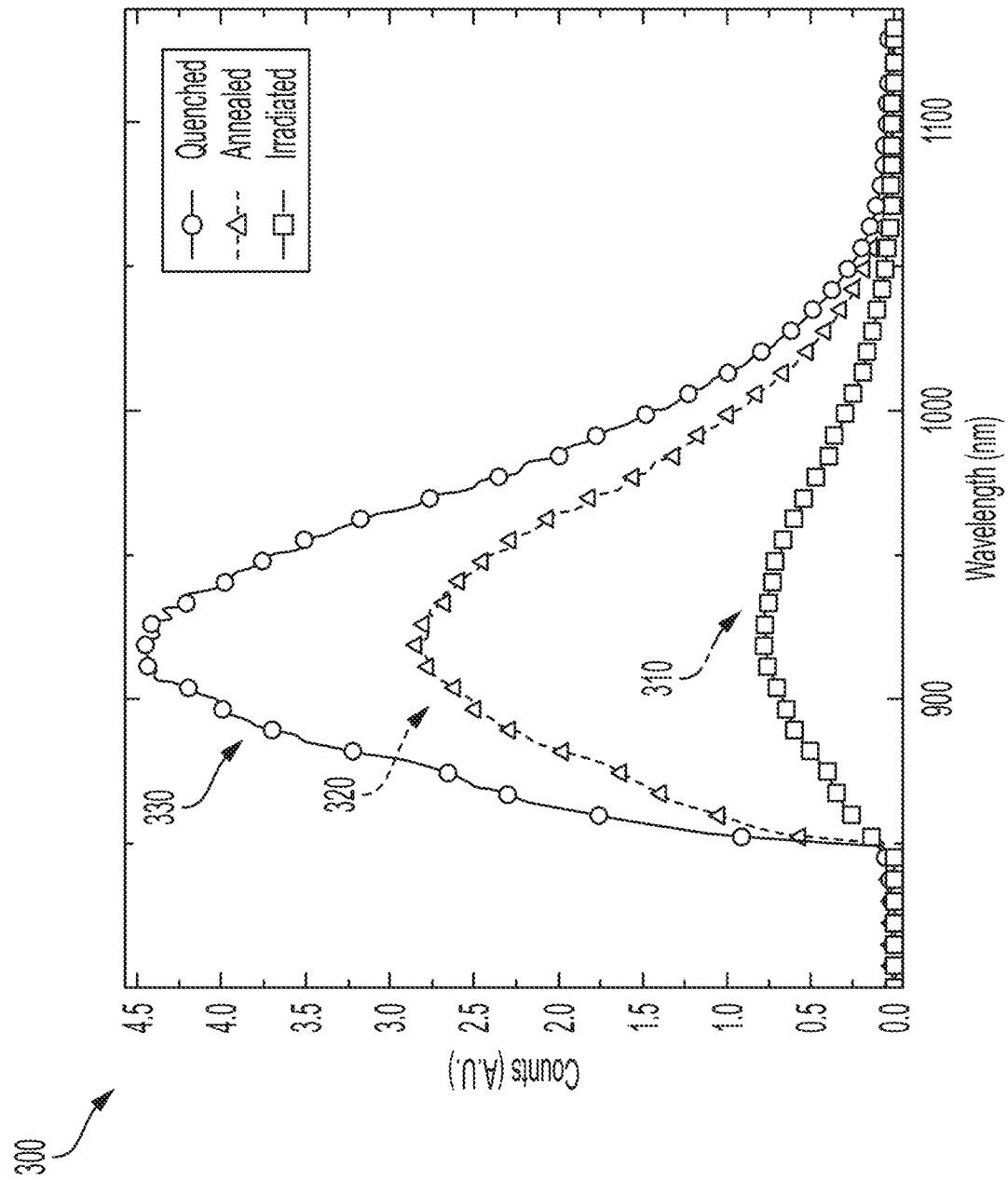
FIG. 3 illustrates plots of photoluminescence emission for irradiated, annealed, and quenched silicon carbide samples according to some example embodiments.

The relative photoluminescence emission for an irradiated, annealed, and quenched SiC sample, according to some example embodiments, are shown in the chart (or plot) 300 of FIG. 3 In this regard, the photoluminescence of the SiC sample following operations of the SiC sample formation process described herein is shown in the plot 300. In this regard, it can be seen that photoluminescence of the SiC sample increases as the process steps through irradiation, annealing, and quenching. In this regard, the measured photoluminescence after irradiating the SiC sample is shown at 310. The measured photoluminescence after annealing the SiC sample is shown at 320, and the measured photoluminescence after quenching the SiC sample is shown at 330. As such, the emission rate of the SiC sample clearly increases with further materials processing as described herein. The photoluminescence yield of the annealed SiC sample (plot 320) is a factor of 4 greater than the irradiated SiC sample (plot 310), while the annealed and quenched SiC sample (plot 330) is a factor of 6 greater. As such, according to some example embodiments, a 50% improvement may be realized by the annealing operation (i.e., prior to a quenching operation 230 as described herein), which indicates that the transformation of $V_{Si}^-$ to $V_C C_{Si}^{2+}$ may be a potentially a limiting factor for ensemble density.

Figure 4:
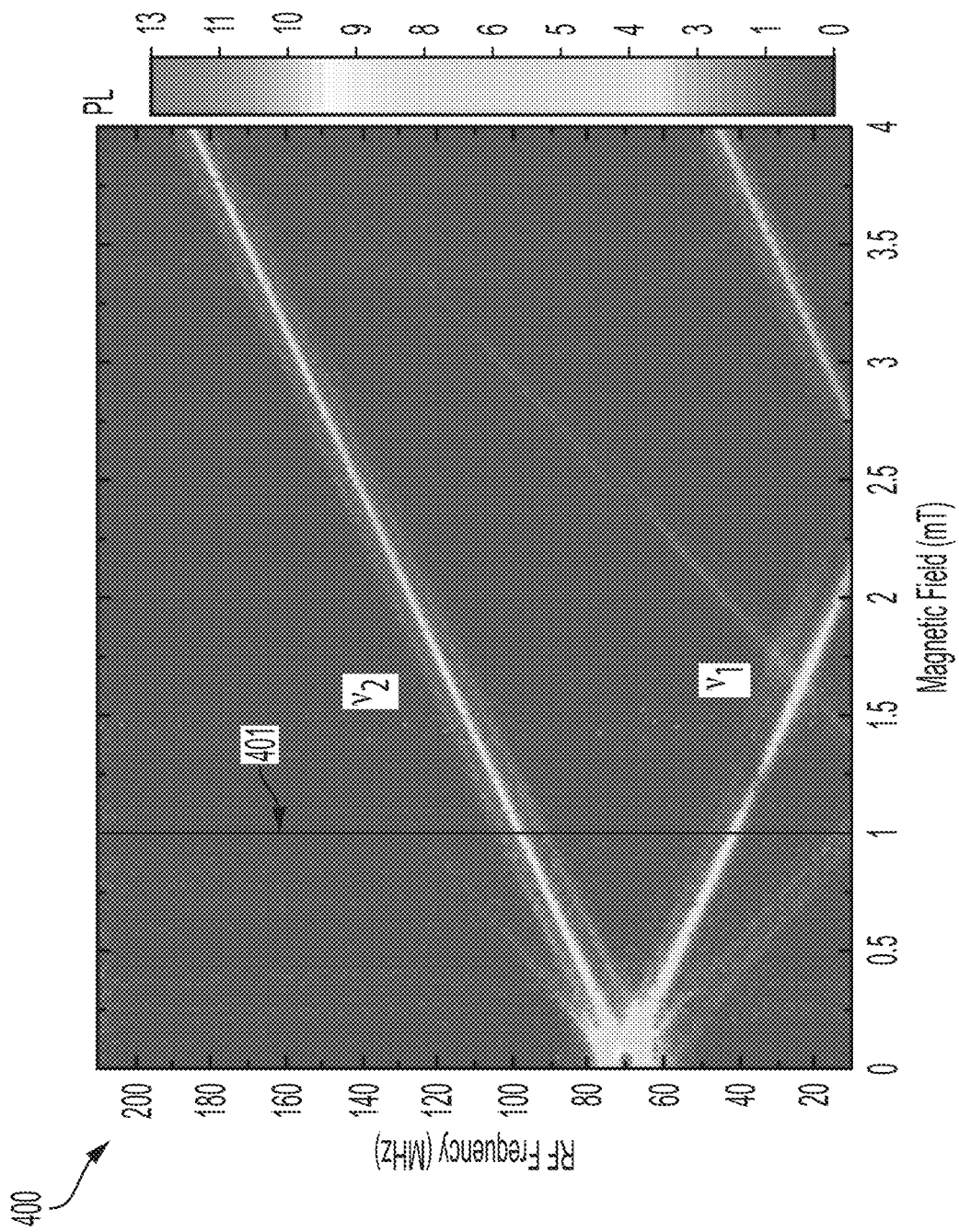
FIG. 4 illustrates an image of a magnetic resonance spectrum image of an annealed silicon carbide sample according to some example embodiments.

Additionally, optically detected magnetic resonance (ODMR) measurements of the SiC samples formed via, for example, the method above can be taken. To do so, an RF drive may be provided by the function generator 44 at connection 36 and through the amplifier 34 to the inner Helmholtz coils 30, and a response signal may be detected with the lock-in amplifier 42 to measure the photoluminescence change resulting from the ensemble (i.e., SiC Sample 32) being on resonance. FIG. 4 illustrates a high resolution image of the ODMR spectrum of an annealed SiC sample in the image 400. Spectrum image 400 is provided with a magnitude of a magnetic field along the x-axis and frequency along the y-axis of the chart with 200 mW of optical power applied. Photoluminescence (PL) is indicated by the shading, which shows distinct defect-related spectral features, which may be referred to a transitions.

Figure 5:
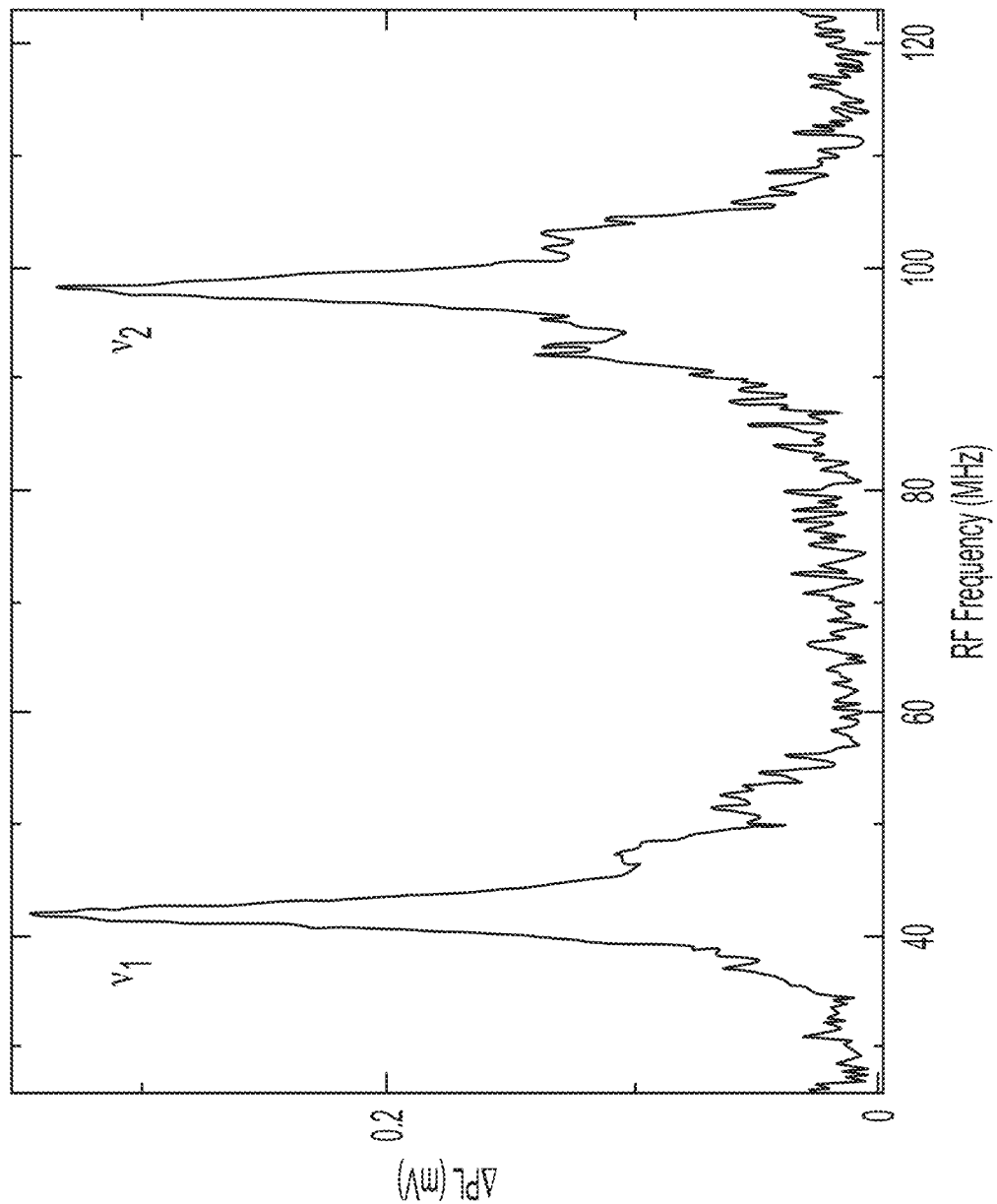
FIG. 5 illustrates a plot of the change in photoluminescence with respect to frequency taken at a 1 millitesla (mT) line of the image of FIG. 4 according to some example embodiments.

The strong lines labeled $v_1$ and $v_2$ correspond to the m=1 transitions from +½→+3/2 and −½→−3/2 respectively. Faint signatures of the higher order m=2 transitions are also visible. Additionally, the dark −½→+½ transition can be seen intersecting the $v_1$ transition at 1.25 mT. FIG. 5 provides a plot 500 taken at a line 401 of FIG. 4 which cuts the ODMR spectrum at 1 mT. The change in photoluminescence is with respect to frequency, with associated peaks being labeled for the transition $v_1$ and the transition in the chart 500. Additionally, according to some example embodiments, hyperfine coupling of $^{29}Si$ is observed at ±5 MHz for the $v_2$ transition. All further measurements in the chart 500 were conducted at a bias magnetic field of 1 mT to minimize the influence of the Earth and laboratory fields.

Additionally, to study power broadening, the pump laser 12 and RF power provided by the function generator 44 may be fixed, but the RF frequency may be swept across the $v_2$ transition labeled in the plot 500 of FIG. 5. After an ODMR peak is acquired, a Lorentzian peak may be fit to extract the full width at half maximum (FWHM) frequency and the height of the peak which may be normalized by the voltage out of the photodiode 24, operating as a photodetector, to calculate the ODMR contrast. This process may be repeated as the RF and optical powers are also swept. The dependence of the contrast and FWHM as a function of RF and optical power is presented with respect to a post-annealed SiC sample and a post-quenched SiC sample as labeled in the plots 600-603 of FIG. 6 and plots 700-703 of FIG. 7.

Figure 6:
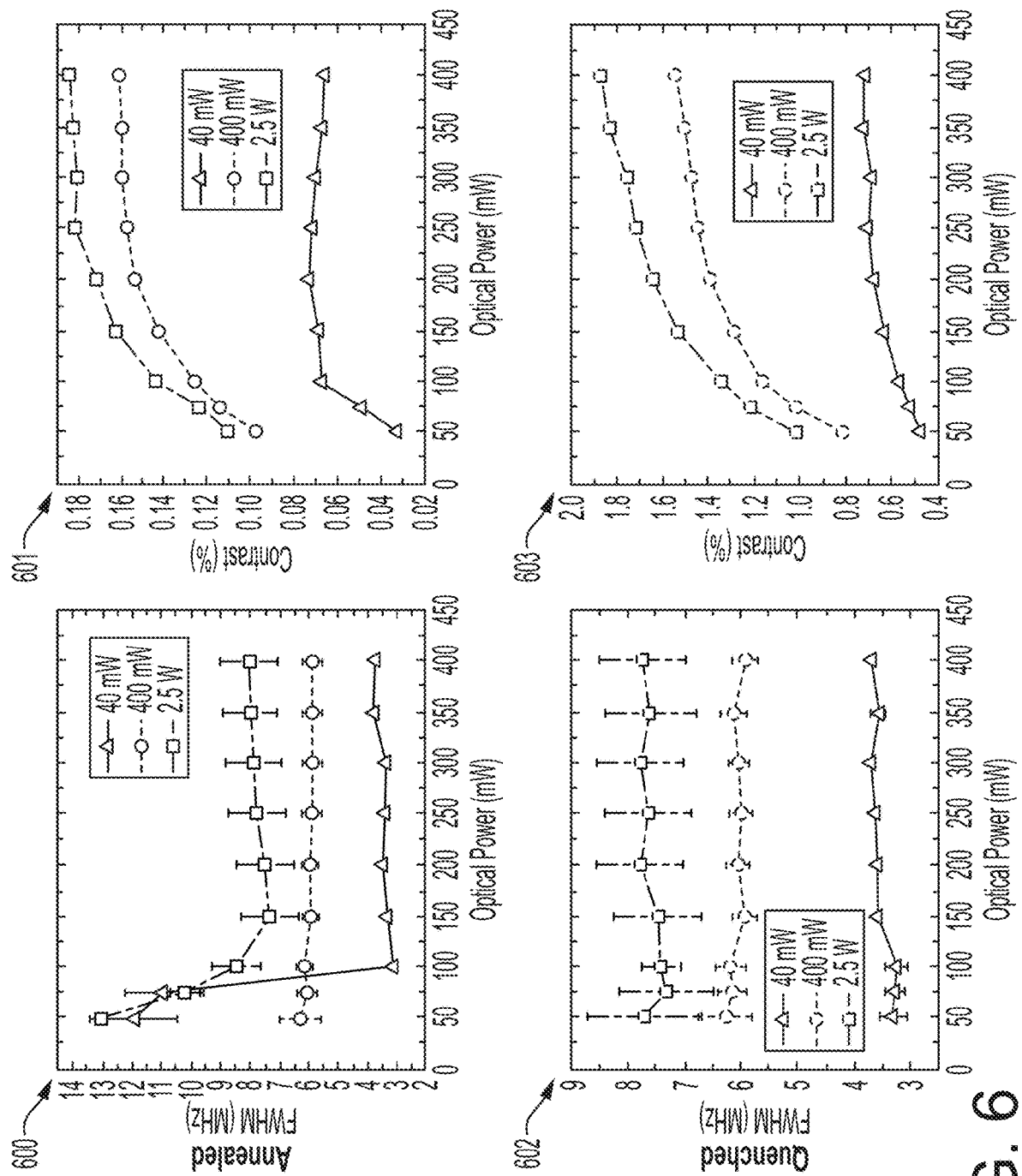
FIG. 6 illustrates a collection of plots of full width at half maximum (FWHM) frequencies and contrast with respect to optical power for annealed and quenched silicon carbide samples according to some example embodiments.
Figure 7:
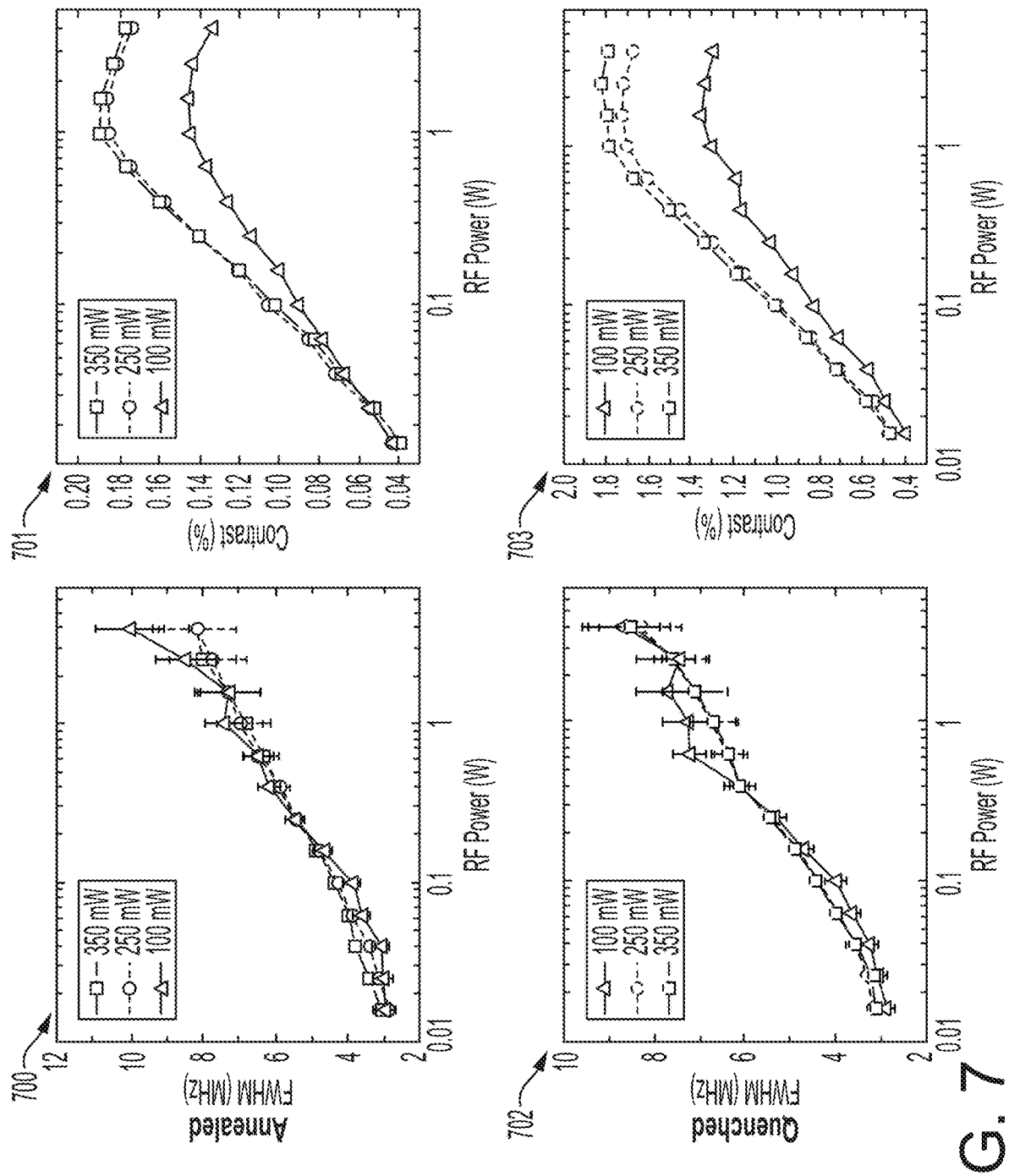
FIG. 7 illustrates a collection of plots of FWHM frequencies and contrast with respect to radio frequency (RF) power according to some example embodiments.

In this regard, plots 600-603 of FIG. 6 illustrate the optical power broadening measurements for the samples. Plot 600 is an FWHM plot, and plot 601 is a plot that shows the contrast versus optical power for different RF powers with the annealed samples. Plot 602 is a FWHM plot and plot 603 is a plot that shows the contrast versus optical power for different RF powers with the quenched sample. The error bars in plot 600 and plot 602 represent the 95% confidence intervals for the FWHM from the Lorentzian fitting the data.

Similarly, plots 700-703 illustrate the RF power broadening measurements for the samples. Plot 700 is an FWHM plot, and plot 701 is a plot that shows the contrast versus RF power for different optical powers with the annealed samples. Plot 702 is an FWHM plot, and plot 703 is a plot that shows the contrast versus RF power for different optical powers with the quenched sample. Again, the error bars in plot 700 and plot 702 represent the 95% confidence intervals for the FWHM from the Lorentzian fitting the data.

As can be determined from these plots, the FWHM, according to some example embodiments, is essentially independent of optical power for the SiC samples as seen in FIG. 6. A primary difference in the optical broadening response between the annealed and quenched samples is that the quenched sample has a greater contrast by a factor of 10 as shown in plots 601 and 603. This is also observed with the RF broadening response in plots 701 and 703.

Figure 8:
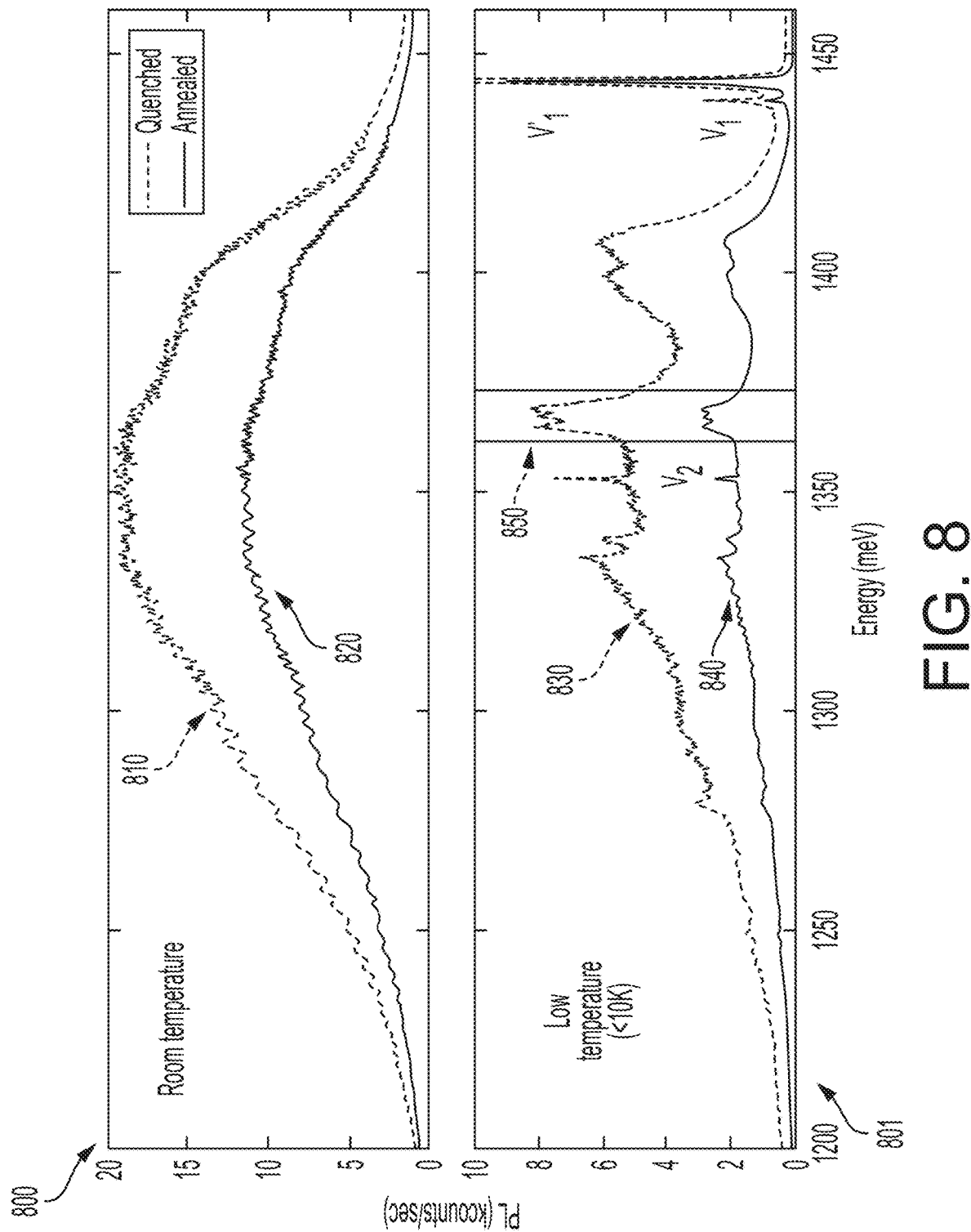
FIG. 8 illustrates photoluminescence spectra of annealed and quenched silicon carbide samples at room temperature and at a low temperature according to some example embodiments.

To understand the difference in contrast between the annealed and quenched samples, the photoluminescence emission spectra may be measured at a low temperature. The results of such are presented in plots 800 and 801 in FIG. 8 and charts 900 and 901 of FIG. 9. The chart 800 of FIG. 8 illustrates photoluminescence measurements at room temperature of the quenched SiC sample measurements at 810 and the annealed SiC sample measurements at 820. The plot 801 provides the photoluminescence measurements at a low temperature (less than 10 K) for comparison, with the quenched SiC sample measurements provided at 830 and the annealed SiC measurements provided at 840. As can be seen in the plot 801, the V'$_1$, V$_1$, and V$_2$ zero photon lines (ZPL) are resolvable. The V'$_1$, V$_1$, and V$_2$ ZPLs of the $V_{Si}^-$ labeled in plot 801 are visible at about 1445, 1440 and 1354 meV, respectively. There is an unidentified feature 850 centered at 1370 meV in the highlighted section.

Figure 9:
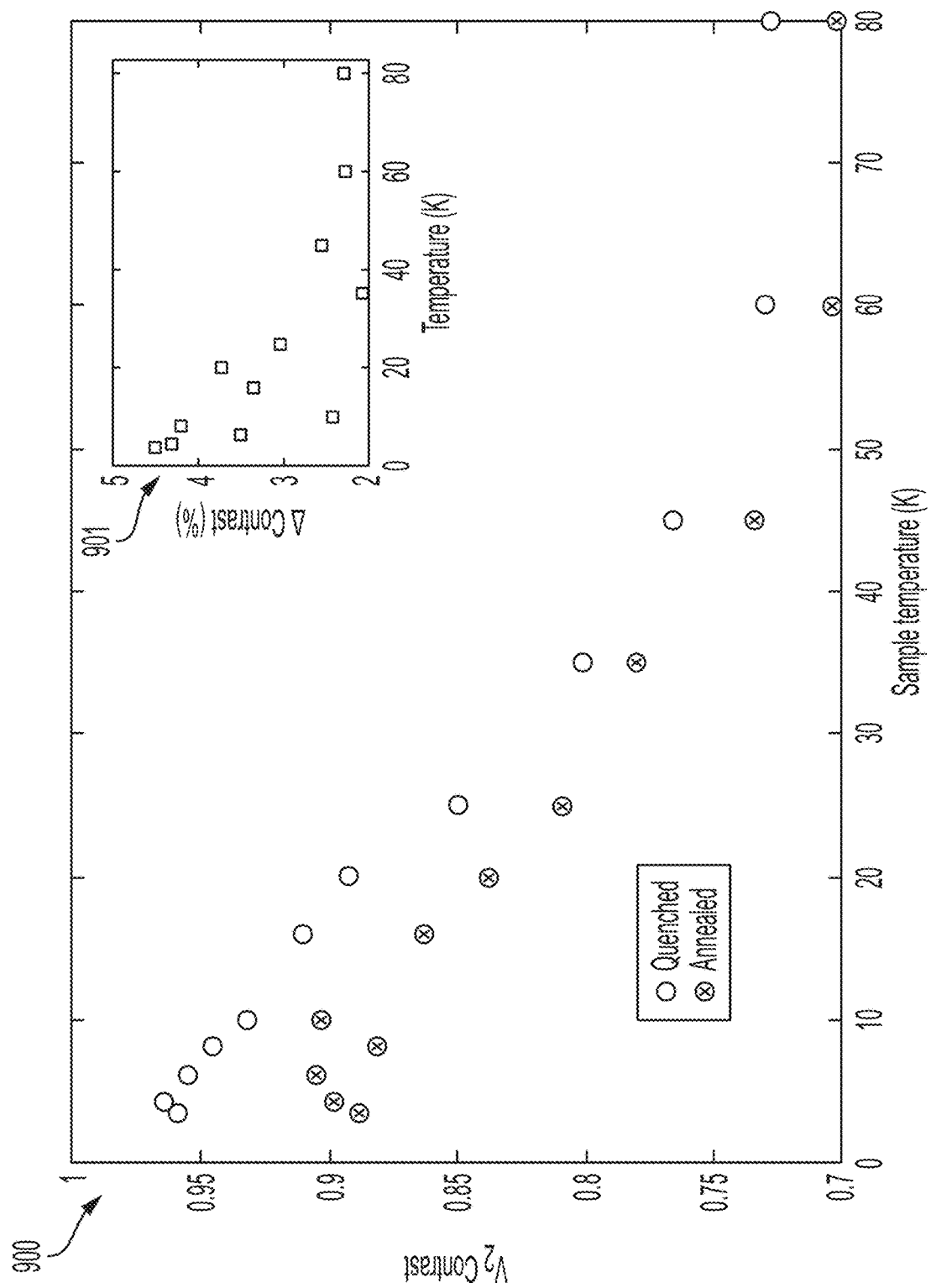
FIG. 9 illustrates peak relative amplitudes of the a zero photon line feature with respect to temperature according to some example embodiments.

In the plot 900 of FIG. 9, the peak relative amplitudes of the $V_2$ ZPL to this unidentified feature as a function of temperature is compared. In this regard, as seen in the plot 900, the relative amplitude on the y-axis is labeled as $V_2$ Contrast, which is the relative amplitude of the $V_2$ ZPL versus the non-$V_{Si}^-$ peak at 1370 meV for the quenched and annealed samples versus temperature. The chart 901 shows the relative difference of the quenched sample versus the annealed sample $V_2$ Contrast. As such, referring to the plot 900, the peak relative amplitude of the $V_2$ ZPL to the 1370 meV feature for the quenched sample is consistently larger than with the annealed sample as temperature is lowered. Additionally, the peak relative amplitude for the quenched sample increases as temperature is lowered. As such, it appears that the thermal quench reduces the transformation of the $V_{Si}^-$ to other defects, and that the quench also minimizes the formation of the defect responsible for the 1370 meV peak. As such, according to some example embodiments, the improvement in materials processing through quenching the SiC sample drives the improved brightness and contrast of the quenched sample, and the improved ODMR contrast of the quenched sample may be due to two synergistic factors, i.e., the relative increase in the formation of the silicon vacancy and the relative decrease in the formation of the unknown bright defect at 1370 meV which has spectral overlap with the $V_{Si}^-$.

Additionally, according to some example embodiments, the applied RF and optical powers may be optimized to minimize the shot noise sensitivity, which may operate to accurately benchmark the ultimate sensitivity of a quantum defect ODMR-based magnetometer that may be constructed. To determine the optimal RF and optical power, the shot noise sensitivity may be determined according to Eq. (2) by measuring the FWHM, contrast, and photon emission rate of the ODMR response. The FWHM may be measured by fitting a Lorentzian peak to the ODMR response. The contrast may be calculated by taking the lock-in voltage at the ODMR peak, subtracting the lock-in baseline voltage, and dividing the remainder by the DC voltage of the photodetector (e.g., photodiode 24). The photon emission rate may be measured by converting the voltage out of the photodetector to a rate of photons through the responsivity and trans-impedance gain of the photodetector.

Figure 10:
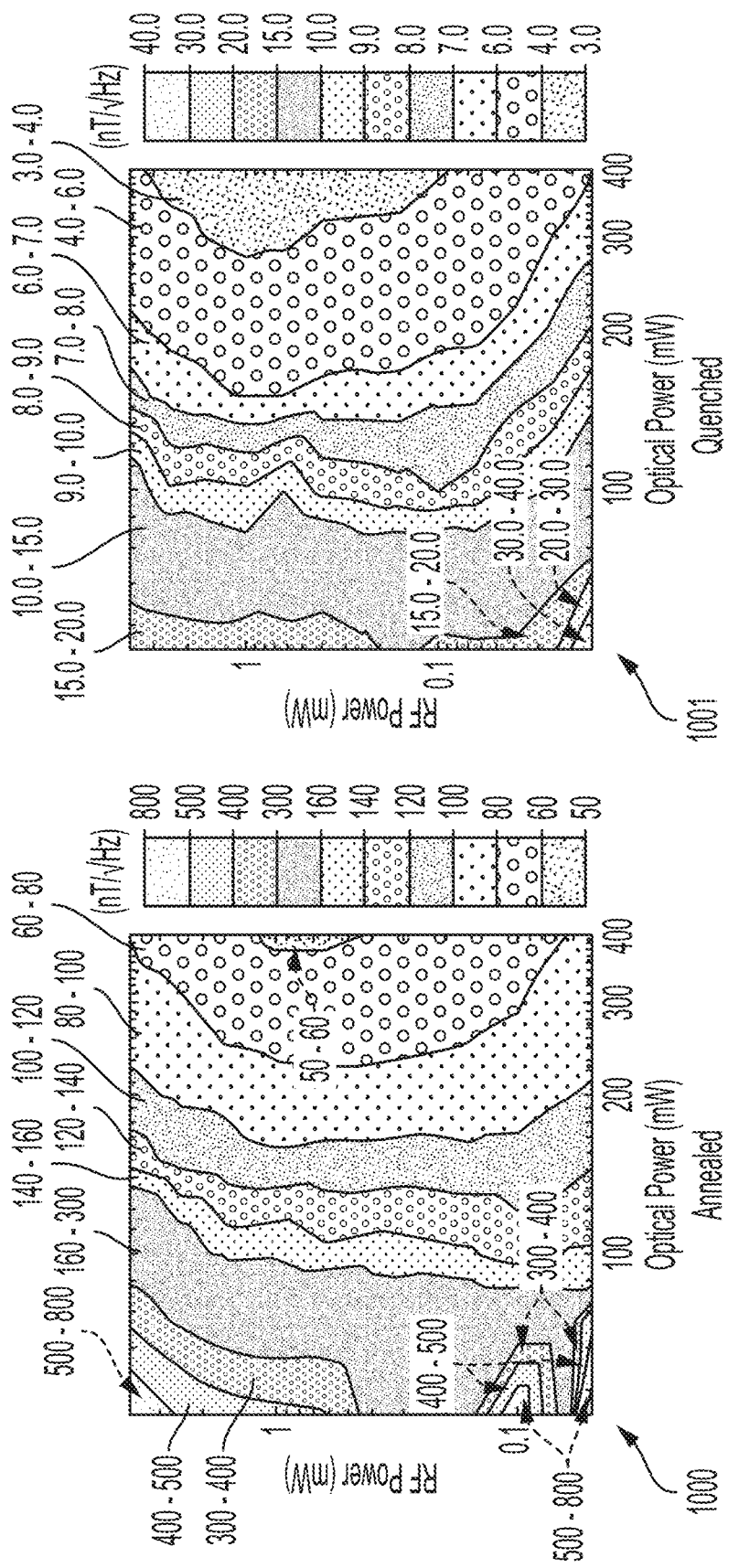
FIG. 10 illustrates sensitivity map plots of annealed and quenched silicon carbide samples according to some example embodiments.

In FIG. 10, a sensitivity map plot 1000 for the annealed sample and a sensitivity map plot 1001 for a quenched sample are provided. The quenched sample has a factor of 15 improved sensitivity relative to the annealed sample while the improvement of the quenched versus annealed photoluminescence intensity is only a factor of 1.5 higher as shown in the chart 200 of FIG. 2. From Eq. (2), an improvement in the shot noise sensitivity of a factor of $$\frac{1}{10\sqrt{15}} \approx 0.08$$

from the increase in the $V_{Si}^-$ PL from quenching may be realized. Thus, the improved sensitivity may be due, at least in part, to the higher contrast of the quenched sample relative to the annealed samples shown in plots 601 and 603 of FIG. 6. The lowest sensitivity attained for the SiC samples, according to some example embodiments, is 3.5 nT/$\sqrt{Hz}$ with the quenched sample by applying, for example, an optical power of 400 mW and RF power of 1 W. Further, the sensitivity may eventually decrease with increasing the optical power.

Figure 11:
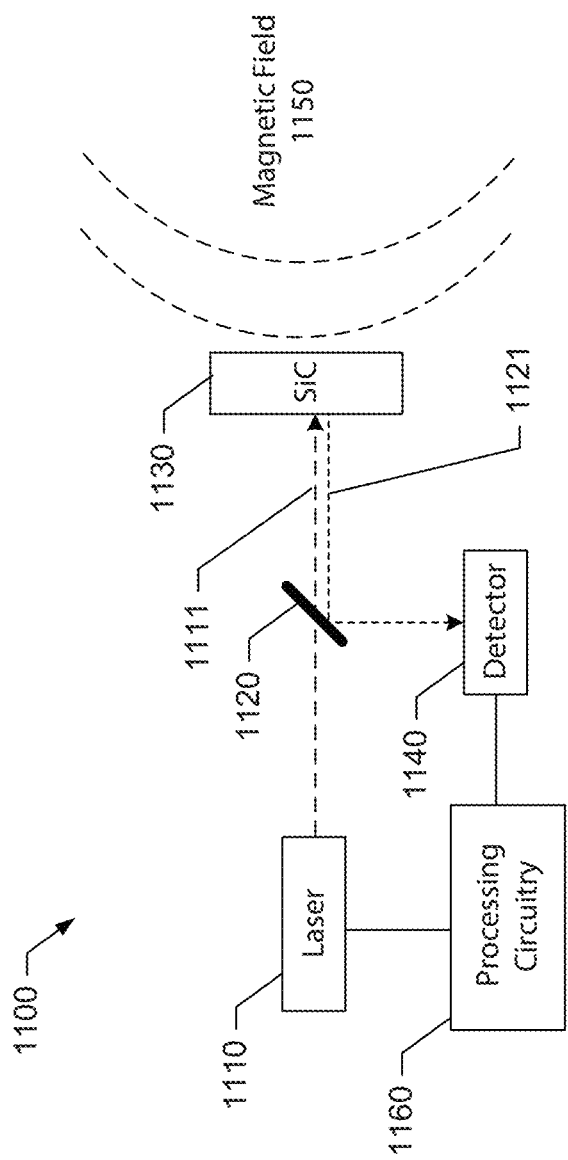
FIG. 11 illustrates a block diagram of a magnetometer apparatus according to some example embodiments.

Based on the foregoing, a SiC material may be formed using the methods described herein that can be leveraged for use in a magnetometer. In this regard, according to some example embodiments, a magnetometer apparatus 1100 is shown in FIG. 11. The magnetometer apparatus 1100 may be configured to detect a magnetic field 1150 and measure a magnitude of a magnetic field 1150. In this regard, the magnetometer apparatus 1100 may include a laser 1110, a mirror 1120, a SiC sample 1130, a detector 1140, and processing circuitry 1160.

The laser 1110, which may be the same or similar to the pump laser 12, may output an signal 1111 (e.g., an optical signal 1111) that may be received by, and be incident upon, the SiC sample 1130. The SiC sample 1130 may be formed as an annealed SiC sample or a quenched SiC sample, as described herein. The SiC sample 1130 may, according to some example embodiments, include a plurality of negatively charged silicon mono-vacancy defects. The presence of the defects in the SiC sample 1130 may cause a reflected signal 1121 (e.g., a reflected optical signal 1121) from the SiC sample 1130 to be altered due to the presence of the magnetic field 1150. As such, the reflected optical signal 1121, routed via the mirror 1120 and received at the detector (e.g., photodetector), may include information about the magnetic field 1150 based on the effect on the optical signal reflected from the SiC sample 1130.

The processing circuitry 1160 may be hardware-based (e.g., field programmable gate array (FPGA), application specific integrated circuit (ASIC)) or the processing circuitry may include a processor and a memory with software instructions for execution by the processor to perform the functionality of the processing circuitry 1160 as described herein. In this regard, the processing circuitry 1160 may be configured to control the signal 1111 output by the laser 1110. The processing circuitry 1160 may also be configured to receive a representation of the signal 1121 received at the detector 1140 as an input signal. The controlled output of the laser 1110 may be compared to the input signal from the detector 1140 to extract information about the state of the SiC sample 1130 due to the effect of the magnetic field 1150. This extracted information may be converted into an indication of the presence or magnitude of the magnetic field 1150. In this manner, a magnetometer may be realized that is based on the characteristics of the SiC sample 1130 and the effect of the magnetic field on the photoluminescence of the SiC sample 1130.

As such, according to some example embodiments, magnetometry solutions in the form of a magnetometer may be constructed based on a SiC sample formed as described herein. The SiC sample may be formed to have a plurality of negatively charged silicon mono-vacancy defects. To form the SiC sample, a cut raw SiC sample may be irradiated, annealed, and quenched to form the silicon carbide sample with a plurality of negatively charged silicon mono-vacancy defects. According to some example embodiments, the SiC sample may include a four layer hexagonal polytype. The plurality of negatively charged silicon mono-vacancy defects may be point defects in a crystalline material of the silicon carbide sample. Further, the operation of irradiating the SiC sample may include neutron irradiating the sample. The SiC sample with the plurality of negatively charged silicon mono-vacancy defects may exhibit a shot noise sensitivity in a range of about 3.5 nT/$\sqrt{Hz}$ to 2.0 nT/$\sqrt{Hz}$.

Some further example embodiments will now be described, which may be combined and modified as described herein, as understood by one of ordinary skill in the art. In this regard, an example method for forming a silicon carbide material with a plurality of negatively charged silicon mono-vacancy defects is provided. The example method may include irradiating a silicon carbide sample, annealing the irradiated silicon carbide sample in an annealing operation, and quenching the annealed silicon carbide sample. The quenching may include heating the annealed silicon carbide sample to a maximum temperature and quenching the annealed silicon carbide sample to form the silicon carbide sample with the plurality of negatively charged silicon mono-vacancy defects. Additionally, according to some example embodiments, the silicon carbide sample may be a four layer hexagonal polytype. Additionally or alternatively, according to some example embodiments, the plurality of negatively charged silicon mono-vacancy defects may be point defects in a crystalline material of the silicon carbide sample. Additionally or alternatively, according to some example embodiments, irradiating the silicon carbide sample may include neutron irradiating the silicon carbide sample. Additionally or alternatively, according to some example embodiments, the silicon carbide sample with the plurality of negatively charged silicon mono-vacancy defects may exhibit a shot noise sensitivity in a range of about 3.5 nT/$\sqrt{Hz}$ to 2.0 nT/$\sqrt{Hz}$. Additionally or alternatively, according to some example embodiments, the annealing operation may include cooling the irradiated silicon carbide sample to room temperature. Additionally or alternatively, according to some example embodiments, the silicon carbide sample may exhibit a photoluminescence spectra with zero photon lines at about 1445, 1440, and 1354 millielectronvolts (meV) at temperatures below 10 Kelvin. Additionally or alternatively, according to some example embodiments, the silicon carbide sample with the plurality of negatively charged silicon mono-vacancy defects may respond to a presence of a magnetic field with a change in photoluminescence.

According to some example embodiments, an example apparatus in the form of a magnetometer apparatus is provided. The magnetometer apparatus may include a laser, a silicon carbide sample with a plurality of negatively charged silicon mono-vacancy defects, and a detector configured to receive an optical signal after interaction with the silicon carbide sample and originating from the laser. The optical signal may include information about a magnetic field that has been subjected to the silicon carbide sample. Additionally, according to some example embodiments, the magnetometer apparatus may further include processing circuitry configured to control an output of the laser and receive an input signal from the detector. The input signal may be based on the optical signal received by the detector. Additionally or alternatively, according to some example embodiments, the detector may include a photodiode. Additionally or alternatively, according to some example embodiments, the silicon carbide sample may be formed via a method including irradiating, annealing, and quenching the silicon carbide sample. Additionally or alternatively, according to some example embodiments, the silicon carbide sample may be a four layer hexagonal polytype. Additionally or alternatively, according to some example embodiments, the plurality of negatively charged silicon mono-vacancy defects may be point defects in a crystalline material of the silicon carbide sample. Additionally or alternatively, according to some example embodiments, the silicon carbide sample with the plurality of negatively charged silicon mono-vacancy defects may exhibit a shot noise sensitivity in a range of about 3.5 nT/$\sqrt{Hz}$ to 2.0 nT/$\sqrt{Hz}$. Additionally or alternatively, according to some example embodiments, the silicon carbide sample may exhibit a photoluminescence spectra with zero photon lines at about 1445, 1440, and 1354 millielectronvolts at temperatures below 10 Kelvin. Additionally or alternatively, according to some example embodiments, the silicon carbide sample with the plurality of negatively charged silicon mono-vacancy defects may respond to a presence of a magnetic field with a change in photoluminescence.

According to some example embodiments, an example material is provided. The material may include silicon carbide with a plurality of negatively charged silicon mono-vacancy defects. Further, the material may exhibit a shot noise sensitivity in a range of about 3.5 nT/$\sqrt{Hz}$ to 2.0 nT/$\sqrt{Hz}$. Additionally, according to some example embodiments, the material exhibits a photoluminescence spectra with zero photon lines at about 1445, 1440, and 1354 millielectronvolts (meV) at temperatures below 10 Kelvin. Additionally or alternatively, according to some example embodiments, the plurality of negatively charged silicon mono-vacancy defects may cause the material to respond to a presence of a magnetic field with a change in photoluminescence.

Many modifications and other embodiments of the measuring device set forth herein will come to mind to one skilled in the art to which these inventions pertain having the benefit of the teachings presented in the foregoing descriptions and the associated drawings. Therefore, it is to be understood that the measuring devices are not to be limited to the specific embodiments disclosed and that modifications and other embodiments are intended to be included within the scope of the appended claims. Moreover, although the foregoing descriptions and the associated drawings describe exemplary embodiments in the context of certain exemplary combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. In cases where advantages, benefits or solutions to problems are described herein, it should be appreciated that such advantages, benefits and/or solutions may be applicable to some example embodiments, but not necessarily all example embodiments. Thus, any advantages, benefits or solutions described herein should not be thought of as being critical, required or essential to all embodiments or to that which is claimed herein. Although specific terms are employed herein, they are used in a generic and descriptive sense only and not for purposes of limitation.

What is claimed is:

1. A method for forming a silicon carbide material with a plurality of negatively charged silicon mono-vacancy defects, the method comprising:
   irradiating a silicon carbide sample to form an irradiated silicon carbide sample;
   annealing the irradiated silicon carbide sample in an annealing operation to form an annealed silicon carbide sample; and
   quenching the annealed silicon carbide sample, wherein the quenching comprises heating the annealed silicon carbide sample to a maximum temperature and quenching the annealed silicon carbide sample to form the silicon carbide sample with the plurality of negatively charged silicon mono-vacancy defects;

wherein the silicon carbide sample exhibits a photoluminescence spectra with zero photon lines at about 1445, 1440, and 1354 millielectronvolts at temperatures below 10 Kelvin.

2. The method of claim 1, wherein the n-type SiC wafer is a four layer hexagonal polytype.

3. The method of claim 1, wherein the plurality of negatively charged silicon mono-vacancy defects are point defects in a crystalline material of the silicon carbide sample the plurality of negatively charged silicon mono-vacancy defects.

4. The method of claim 1, wherein irradiating the silicon carbide sample comprises neutron irradiating the silicon carbide sample.

5. A method for forming a silicon carbide material with a plurality of negatively charged silicon mono-vacancy defects, the method comprising:

irradiating a silicon carbide sample to form an irradiated silicon carbide sample;

annealing the irradiated silicon carbide sample in an annealing operation to form an annealed silicon carbide sample; and quenching the annealed silicon carbide sample, wherein the quenching comprises heating the annealed silicon carbide sample to a maximum temperature and quenching the annealed silicon carbide sample to form the silicon carbide sample with the plurality of negatively charged silicon mono-vacancy defects, wherein the silicon carbide sample with the plurality of negatively charged silicon mono-vacancy defects exhibits a shot noise sensitivity in a range of about 3.5 $nT/\sqrt{Hz}$ to 2.0 $nT/\sqrt{Hz}$.

6. The method of claim 1, wherein the annealing operation comprises cooling the irradiated silicon carbide sample to room temperature.

7. The method of claim 1 further comprising cutting or dicing a SiC substrate comprising a purity layer with a nitrogen doping below $5.0 \times 10^{14}$ $cm^{-3}$ disposed on an n-type SiC wafer to form the silicon carbide sample prior to irradiating.

8. The method of claim 1, wherein the silicon carbide sample with the plurality of negatively charged silicon mono-vacancy defects responds to a presence of a magnetic field with a change in photoluminescence.

\* \* \* \* \*